United States Patent
Offenberg et al.

(10) Patent No.: US 6,368,885 B1
(45) Date of Patent: Apr. 9, 2002

(54) METHOD FOR MANUFACTURING A MICROMECHANICAL COMPONENT

(75) Inventors: Michael Offenberg, Kirchentellinsfurt; Udo Bischof, Wannweil, both of (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/641,438

(22) Filed: Aug. 17, 2000

(30) Foreign Application Priority Data

Aug. 19, 1999 (DE) .......................... 199 39 318

(51) Int. Cl.$^7$ .......................... G01R 31/26; H01L 21/66; H01L 21/00
(52) U.S. Cl. .......................... 438/14; 438/50; 438/902; 438/928; 438/976
(58) Field of Search .......................... 438/14, 50, 902, 438/976, 928; 73/777

(56) References Cited

U.S. PATENT DOCUMENTS 5,527,744 A * 6/1996 Mignardi et al. .......... 437/226
5,903,380 A * 5/1999 Motamedi et al. .......... 359/224
6,080,675 A * 6/2000 Prall et al. .................. 438/694
6,140,689 A * 10/2000 Scheiter et al. ............. 257/414
6,204,087 B1 * 3/2001 Parker et al. ................ 438/56
6,225,145 B1 * 5/2001 Choi et al. .................. 438/120

FOREIGN PATENT DOCUMENTS

DE 44 42 033 2/1997
DE 195 39 049 4/1997

\* cited by examiner

Primary Examiner—Richard Elms
Assistant Examiner—Adam Pyonin
(74) Attorney, Agent, or Firm—Kenyon & Kenyon

(57) ABSTRACT

A method for manufacturing a micromechanical component, in particular, a surface-micromechanical yaw sensor, includes the following steps: providing a substrate having a front side and a back side; forming a micromechanical pattern on the front side; applying a protective layer on the micromechanical pattern on the front side; forming a micromechanical pattern on the back side, a resting on the micromechanical pattern on the front side taking place at least temporarily; removing the protective layer on the front side; and optionally further processing the micromechanical pattern on the front side and/or the micromechanical pattern on the back side.

7 Claims, 2 Drawing Sheets

METHOD FOR MANUFACTURING A MICROMECHANICAL COMPONENT

FIELD OF THE INVENTION

The present invention relates to a method for manufacturing a micromechanical component, in particular, a surface-micromechanical yaw sensor, including the steps of forming a micromechanical pattern on the front side and on the back side.

BACKGROUND INFORMATION

Although in principle applicable to any micromechanical components, the present invention and its underlying problem are explained in greater detail with respect to this known surface-micromechanical yaw sensor.

When manufacturing micromechanical components, in addition to the front side of a wafer, for example, made of silicon, it is also possible to process the back side to make a micromechanical pattern on it. If, in the process, micromechanical patterns or layers are already located on the front side of the wafer, these patterns or layers can be damaged or contaminated by particles by putting the wafer down on an equipment holder. This can negatively influence the operability of the completed component.

German Patent No. 195 39 049 relates to a method for manufacturing a Coriolis yaw sensor having vibrating carrier masses resiliently suspended on a substrate as well as driving means for exciting a planar vibration of the carrier masses, and evaluating means for detecting a Coriolis acceleration. Provision is made for the vibrating carrier masses as well as for the driving means and integrated limit stops to be patterned from a silicon wafer in a joint operation by plasma etching.

In the specific cause of the yaw sensor which is known form German Patent No. 195 39 949, both surface- and bulk-micromechanical operations are necessary. In this context, the wafer is put down on equipment holders with the already pretreated front side for the processing on the back side. Possibly existing particle in these devices can adhere to the patterned surface of the front side and be transferred to the underlying layers during later etching steps. By the subsequent process steps, freely movable particles can be formed which constitute a reliability problem in the respective micromechanical component.

From German Patent No. 44 42 033, a yaw sensor is known, as well, during whose manufacture front-side and back-side processes have to be carried out on a semiconductor substrate.

FIG. 4 is a schematic sectional view of a known micromechanical yaw sensor which is manufactured according to a conventional method.

In FIG. 4, reference symbol 1 designates an Si-substrate, 2 a lower oxide, 3 a buried printed circuit trace made of polysilicon, 4 refers to an upper oxide, 6 to a bonding frame made of epitaxial polysilicon, 7 a bonding pad made of aluminum, 9 a seal glass, 10 an Si-protective cap, 100 an Si-wafer, 20 a vibrator, 30 a comb structure, VS a front side, and RS a back side.

In the conventional technology, micromechanical patterns are laid bare, in particular on front side VS, from 10 $\mu$m thick layer 6 made of polysilicon by trenching (forming trenches) and removing the underlying sacrificial layer (oxide 2, 4).

On the back side, deep etching into Si-wafer 1 is carried out. During the application and patterning of the etching mask required for this, at least a part of the front-side patterns already exists during this etching step, and the Si-wafer must be put down on its front side. This often results in contaminations and corresponding losses in yield.

SUMMARY OF THE INVENTION

In comparison with the known design approach, the method according to the present invention has the advantage that the reliability and the operability of the micromechanical component can be significantly increased by a simple modification of the known method, namely only by adding a deposition step and an etching step, and that the particle contamination during the double-side processing of semiconductor wafers or substrates for micromechanical components can be reduced.

The basic idea of the present invention is, in the processing of micromechanical patterns, to protect the front side of a wafer or substrate by a temporary protective layer during the back-side processing, and to remove the temporary protective layer at an appropriate time so as to reduce the defect density. Thus, the core of the present invention is the introduction of a protective layer on the front side of a substrate which picks up particles during the back-side processing, and which can be removed subsequently together with the particles in a residue-free and selective manner over the already deposited layers or pattens.

According to a preferred embodiment, the protective layer is removed immediately upon the formation of the micromechanical pattern on the back side.

According to a further preferred refinement, the protective layer is left on the back side subsequent to the formation of the micromechanical pattern and used as an additional mask for the further processing of the micromechanical pattern on the front side. This has the advantage of extending the protection to later front-side processes.

According to another preferred embodiment, the protective layer is patterned on the front side.

According to a further preferred refinement, the protective layer is removed selectively by an isotropic wet- or dry-etching process. This has the advantage of an optimum lift-off behavior.

DETAILED DESCRIPTION

Figure 1:
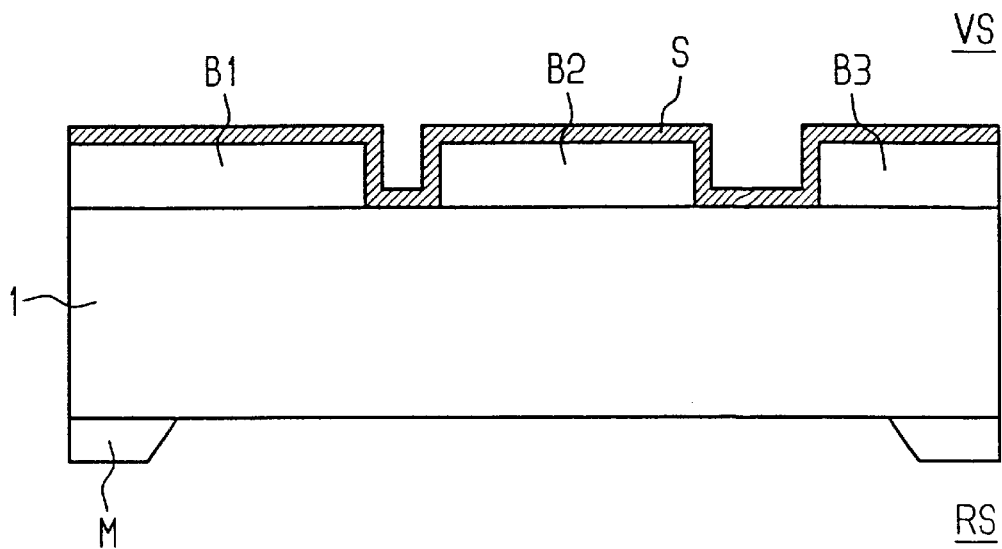
FIG. 1 shows a first schematic sectional view of an embodiment of the method according to the present invention as applied to a micromechanical yaw sensor.
Figure 2:
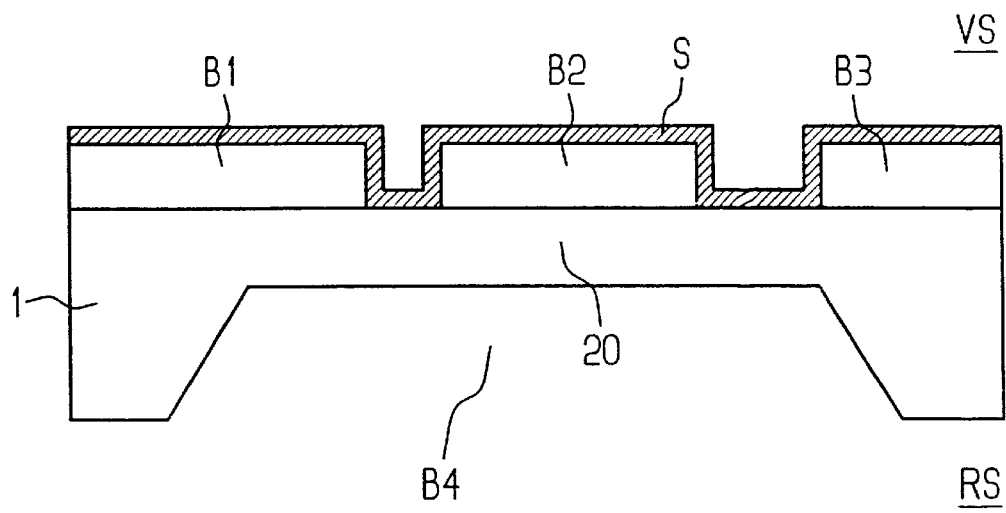
FIG. 2 shows a second schematic sectional view of an embodiment of the method according to the present invention as applied to a micromechanical yaw sensor.
Figure 3:
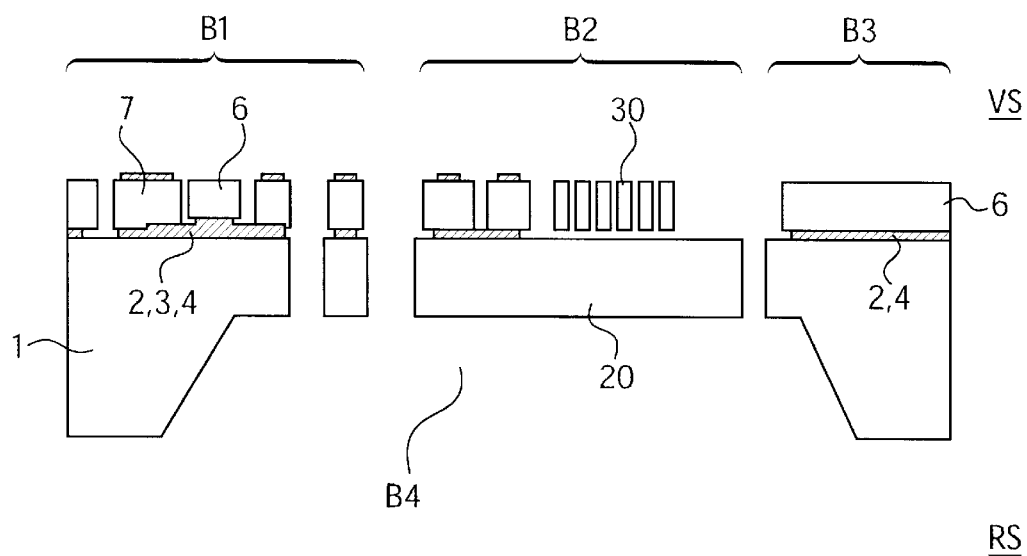
FIG. 3 shows a third schematic sectional view of an embodiment of the method according to the present invention as applied to a micromechanical yaw sensor.
Figure 4:
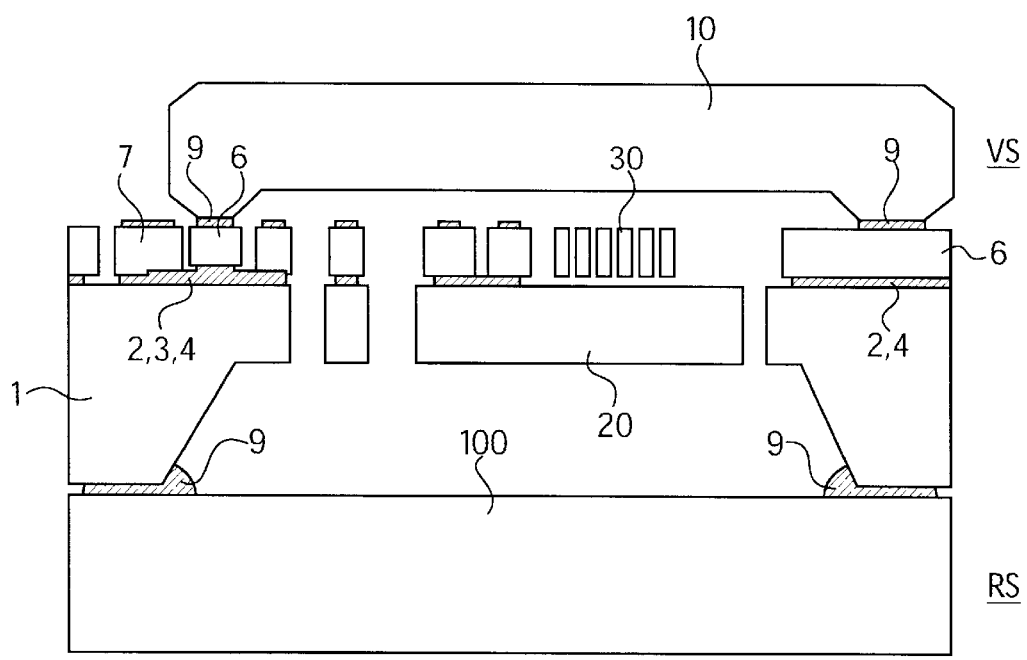
FIG. 4 shows a schematic sectional view of a known micromechanical yaw sensor which is manufactured according to a conventional method.

In FIGS. 1 through 3, identical reference symbols as in FIG. 4 designate identical or functionally identical components.

As schematically indicated in FIG. 1, initially, three micromechanical pattern regions B1, B2, B3 are manufactured on front side VS of Si-wafer 1.

In connection with FIG. 4, this can include, for example, the following steps.

On provided Si-substrate 1, initially, sacrificial layer 2, 4 is formed, including patterned printed circuit trace layer 3 buried therein.

To this end, substrate 1 is oxidized to form first oxide layer 2, and subsequently, printed circuit trace layer 3 is deposited and patterned on first oxide layer 2. Thereupon, second oxide layer 4 is deposited on patterned printed circuit trace layer 3 and on surrounding first oxide layer 2.

Then, a protective layer S is deposited on front-side pattern regions B1, B2, B3 which, in the present case, is an aluminum layer having a thickness in the micrometer range.

A protective layer which is usable effectively, should have the following properties;

temperature stability up to the highest temperature during the back-side processing, for example, usually 350° C.;

no contamination of the process and of the installations used therein, or of the substrate by the protective layer;

selective removability upon the completion of the back-side processing with respect to the layers already located on the wafer;

isotropic removability to guarantee the particle removability by the lift-off.

In the present case of the yaw sensor, the wafer is heated up to 350° C. during the back-side processing. Therefore, aluminum, which is compatible to IC processes, offers itself as material for protective layer S. Besides, aluminum is a very ductile material which absorbs mechanical loads due to the handling of the wafers, for example, scratches, and which effectively protects the underlying layers. Moreover, aluminum can be removed selectively with respect to the layers located on the wafer (here: polysilicon, oxide, nitride).

Then, the masking using a mask M as well as the subsequent etching of the back side of Si-wafer 1 are carried out, a resting on micromechanical pattern B1, B2, B3 on front side VS taking place at least temporarily.

In this context, no damage can occur because of protective layer S.

Subsequent to the processing of the back side and the completion of the back-side micromechanical pattern B4, protective layer S can be removed, preferably in a wet-etching process, particles on the surface being undercut (underetched) and lifted off, i.e., removed by a lift-off. To this end, a dry-etching method can also be used; however, the etching method should preferably act isotropically to guarantee that protective layer S is removed completely.

Thereupon, the via hole (contact hole) and the bonding-pad base is formed in a manner known per se, namely by etching the via hole, depositing an epitaxial polysilicon layer, depositing and patterning a bonding pad metal layer and patterning the epitaxial polysilicon layer for forming the bonding-pad base. In this connection, by the way, a polysilicon layer deposited differently than by epitaxy can be used, as well.

In the process, during the patterning of the epitaxial polysilicon layer, sensor-comb pattern 30 (shown in FIG. 4) and sensor-base pattern 6 are formed concurrently with bonding-pad base 11.

Finally, sacrificial layer 2, 4 is etched, as a result of which sensor-comb pattern 30, with the exception of the suspension region, is made freely suspended, and sensor cap 10 is mounted on sensor-base pattern 6, resulting in the pattern shown in FIG. 4.

Although the present invention is described above on the basis of a preferred exemplary embodiment, it is not limited thereto but can be modified in many ways.

In particular, the protective layer according to the present invention can be applied not only to micromechanical yaw sensors but to any micromechanical components. The choice of the materials for the individual layers is not limited to the specified materials. In particular, the present invention can be used not only for silicon components but also for components made of other micromechanical materials.

Also, the protective layer can remain longer on the front side of the substrate than until the completion of the back-side pattern, and can even be used as additional mask for further front-side process steps.

What is claimed is:

1. A method for manufacturing a micromechanical component, comprising the steps of:

providing a substrate having a front side and having a back side;

forming a first micromechanical pattern on the front side of the substrate;

applying a protective layer on the first micromechanical pattern on the front side;

forming a second micromechanical pattern on the back side of the substrate while the substrate rests on the front side; and removing the protective layer on the front side.

2. The method according to claim 1, wherein the micromechanical component is a surface-micromechanical yaw sensor.

3. The method according to claim 1, further comprising the step of further processing at least one of the first micromechanical pattern on the front side and the second micromechanical pattern on the back side.

4. The method according to claim 1, wherein the protective layer is removed immediately upon formation of the second micromechanical pattern on the back side.

5. The method according to claim 3, wherein the protective layer is left on the front side subsequent to the forming of the second micromechanical pattern and used as an additional mask for the further processing of the first micromechanical pattern on the front side.

6. The method according to claim 1, further comprising the step of patterning the protective layer on the front side.

7. The method according to claim 1, further comprising the step of selectively removing the protective layer by one of an isotropic wet-etching process and an isotropic dry-etching process.

* * * * *